US009450127B2

(12) United States Patent
Sultan et al.

(10) Patent No.: US 9,450,127 B2
(45) Date of Patent: Sep. 20, 2016

(54) PHOTOVOLTAIC MODULE COMPRISING INSULATION LAYER WITH SILANE GROUPS

(75) Inventors: Bernt-Ake Sultan, Stenungsund (SE); Udo Wahner, Linz (AT)

(73) Assignee: Borealis AG, Vienna (AT)

( * ) Notice: Subject to any disclaimer, the term of this patent is extended or adjusted under 35 U.S.C. 154(b) by 808 days.

(21) Appl. No.: 12/995,804

(22) PCT Filed: Jun. 10, 2009

(86) PCT No.: PCT/EP2009/004192
§ 371 (c)(1),
(2), (4) Date: Dec. 2, 2010

(87) PCT Pub. No.: WO2010/003503
PCT Pub. Date: Jan. 14, 2010

(65) Prior Publication Data
US 2011/0126887 A1    Jun. 2, 2011

(30) Foreign Application Priority Data

Jul. 9, 2008 (EP) ..................................... 08012423

(51) Int. Cl.
*H01L 31/0203* (2014.01)
*H01L 31/048* (2014.01)
(52) U.S. Cl.
CPC ........ *H01L 31/0481* (2013.01); *B32B 2457/12* (2013.01); *Y02E 10/50* (2013.01)
(58) Field of Classification Search
USPC ........................................ 136/249, 251, 259
See application file for complete search history.

(56) References Cited

U.S. PATENT DOCUMENTS

| 3,751,378 | A | * | 8/1973 | Cowperthwaite et al. ... 524/574 |
| 4,297,310 | A | | 10/1981 | Akutsu et al. |
| 4,312,918 | A | * | 1/1982 | Bostwick ..................... 428/379 |
| 4,351,876 | A | | 9/1982 | Doi et al. |
| 4,397,981 | A | | 8/1983 | Doi et al. |
| 4,413,066 | A | | 11/1983 | Isaka et al. |
| 4,446,283 | A | | 5/1984 | Doi et al. |
| 4,456,704 | A | | 6/1984 | Fukumura et al. |
| 4,692,557 | A | | 9/1987 | Samuelson et al. |

(Continued)

FOREIGN PATENT DOCUMENTS

| DE | 202 20 444 | 10/2003 |
| EP | 0 449 939 | 9/1994 |

(Continued)

OTHER PUBLICATIONS

Written Opinion of the International Searching Authority mailed Jul. 23, 2009 for International application No. PCT/EP2009/004192.

(Continued)

*Primary Examiner* — Jayne Mershon
(74) *Attorney, Agent, or Firm* — Fay Sharpe LLP

(57) ABSTRACT

The present invention relates to a photovoltaic module comprising a solar cell element and an insulation material laminated to at least one side of the solar cell element wherein the insulation material comprises an olefin copolymer which comprises silane group-containing monomer units, to a process for the production of such a photovoltaic module, and to the use of an olefin copolymer which comprises silane group-containing monomer units for the production of an insulation layer of a photovoltaic module.

9 Claims, 2 Drawing Sheets

(56) References Cited

U.S. PATENT DOCUMENTS

Figure 1:
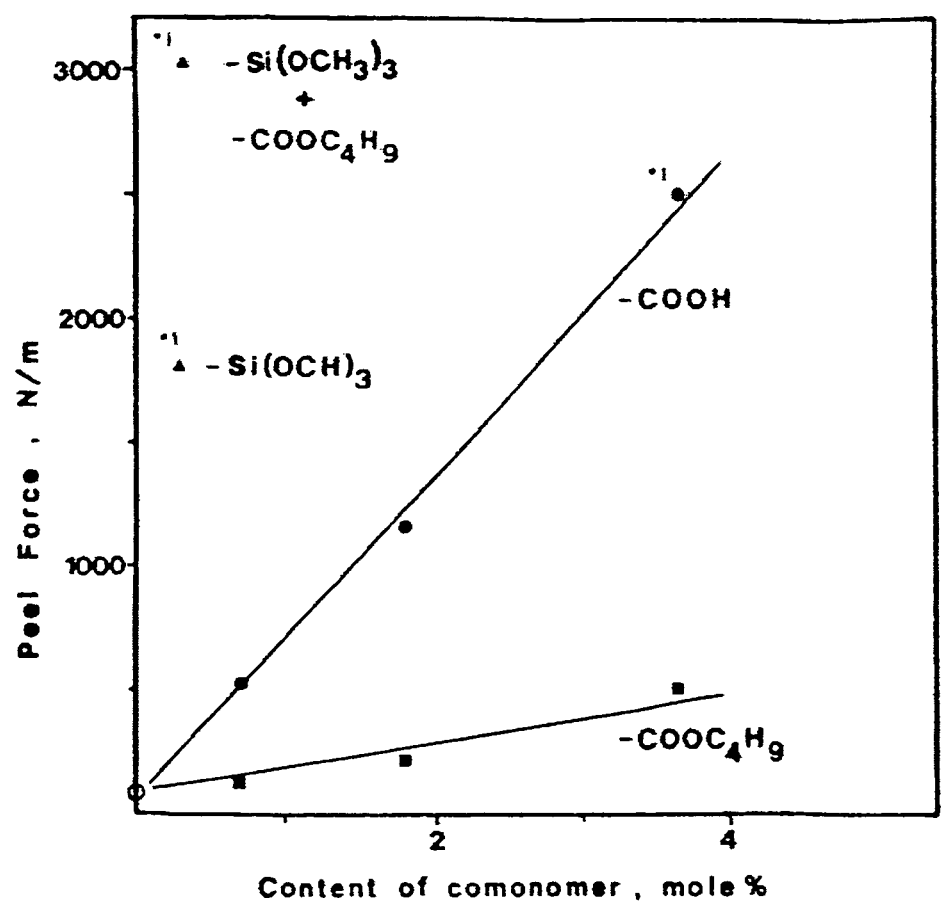

| | | | |
|---|---|---|---|
| 5,350,812 A | 9/1994 | Sultan et al. | |
| 6,320,116 B1 | 11/2001 | Hanoka | |
| 2008/0227898 A1* | 9/2008 | Hagstrand et al. | 524/147 |
| 2008/0283117 A1 | 11/2008 | Tsunomura | |
| 2009/0126781 A1* | 5/2009 | Hayes | B32B 17/10018 136/251 |
| 2010/0000603 A1* | 1/2010 | Tsuzuki et al. | 136/259 |

FOREIGN PATENT DOCUMENTS

| | | | |
|---|---|---|---|
| EP | 1 309 631 | | 4/2005 |
| EP | 1 309 632 | | 4/2005 |
| EP | 1 837 372 | | 9/2007 |
| EP | 1 857 500 | | 11/2007 |
| JP | 05-186610 | * | 1/1993 |
| WO | WO 95/17463 | | 6/1995 |
| WO | WO-95/17463 | | 6/1995 |
| WO | WO 2007/063860 | * | 6/2007 |
| WO | WO 2007/120197 | | 10/2007 |

OTHER PUBLICATIONS

International Preliminary Report on Patentability mailed Oct. 20, 2010 for International application No. PCT/EP2009/004192.

De Orsi, D., et al., "Simple Extraction and HPLC Determination of UV-A and UV-B Filters in Sunscreen Products", Chromatographia 2006, 64, November (No. 9/10).

Czanderna, A.W., et al., "Encapsulation of PV modules using ethylene vinyl acetate copolymer as a pottant: A critical review", N.H. Elsevier, Solar Energy Materials and Solar Cells 43 (1996) 101-181.

Willis, P.B., "Investigation of Test Methods, Material Properties, and Processes for Solar Cell Encapsulants", Eight Annual Report 1984, JPL Contract 954527, Project 6072.1.

European Search Report dated Jan. 13, 2009 for European Application No. EP 08 01 2423.

International Search Report mailed Jul. 23, 2009 for International application No. PCT/EP2009/004192.

Communication dated Mar. 25, 2010 to the European Patent Office for International application No. PCT/EP2009/004192.

* cited by examiner

PHOTOVOLTAIC MODULE COMPRISING INSULATION LAYER WITH SILANE GROUPS

The invention relates to a photovoltaic module comprising a solar cell element and an insulation material laminated to at least one side of the solar cell element, to a process for the production of such a photovoltaic module, and to the use of an olefin copolymer as an insulation material for solar cell elements.

Photovoltaic power generation by use of solar cell or photovoltaic modules is gaining increasing interest due to the unique properties of this mode of power generation which does not produce noise, harmful emissions or polluting gases.

The elements which generate power in those modules through the conversion of light into electrical energy are the solar cell elements which comprise semiconducting materials such as silicon, gallium-arsenic and copper-indium-selenium.

As the materials used for solar cell elements are brittle and sensitive, they must be mechanically supported and protected against detrimental environmental influences such as rain, hail, condensation and evaporation of water, dust, wind etc. Furthermore, reliable electrical isolation of the solar cell elements must be achieved.

These functions, which must be maintained throughout the entire lifetime of a photovoltaic module usually being 20 to 30 years, are provided by a laminate structure of the module comprising a transparent protective front cover and a bottom protective substrate, with the solar cell elements being fixed between layers of these protective materials by use of layers of an insulation material. Usually, the module in addition is protected and supported by an aluminium frame.

The insulation material for solar cell elements is sometimes also referred to as "encapsulation", "embedding", "adhesive" or "pottant".

The main functions of the insulation layers in the photovoltaic module are to secure safe energy transmission within the solar cell and module. In order to do so it has to provide structural support and positioning for the solar cell circuit assembly, to physically and electrically isolate the solar cell elements, i.e. to prevent damage of the elements by external influences and short-circuiting, to provide thermal conduction, and, at least for the upper insulation layer which is exposed to sunlight, to achieve and maintain maximum optical coupling between the solar cell elements and the incident solar radiation, i.e. to provide and keep maximal transmission for the sunlight to the solar cell elements so as to maximize energy yield.

Today, several types of insulation materials are known, such as peroxide cross-linked ethylene-vinyl acetate (EVA) copolymers (see e.g. EP 1 857 500), polystyrene-polybutadiene-polystyrene (SBS) block copolymers (see e.g. U.S. Pat. No. 4,692,557), ionomers (see e.g. U.S. Pat. No. 6,320,116), and polyurethanes (see e.g. DE 20 220 444).

The most common insulation material by far is, however, peroxide cross-linked ethylene-vinyl acetate (EVA) copolymers which for use in photovoltaic modules is extruded as a sheet from an ethylene-vinyl acetate (EVA) copolymer composition comprising an organic peroxide as a cross-linking agent and usually an antioxidant. Cross-linking of the ethylene-vinyl acetate copolymer is necessary to provide the insulation layer with sufficient strength at higher temperatures, because in use, typically, the temperature of the photovoltaic module is between 40 to 80° C.

The laminated photovoltaic module is produced in a vacuum lamination process. In this process, the components of the module after having been assembled are put into a vacuum lamination apparatus, in which by application of an increased temperature of about 100 to 180° C., typically 150° C., and increased pressure for a time of from about 15 to 30 minutes the laminate is formed under vacuum.

It is a first drawback of the use of peroxide cross-linked EVA as insulation material that comparatively high temperatures and long lamination times are needed which are caused by the need to decompose the organic peroxide cross-linking agent in the insulation layer and to effect and finalize cross-linking thereof. Thus, the production speed of the photovoltaic module is comparatively low.

The use of peroxide cross-linked EVA as insulation layer has, however, further drawbacks. It is well known that photovoltaic modules show a performance loss of 1 to 10% per year, and a significant contribution to that loss is attributed to the degradation of the cross-linked EVA layers which may occur as a discoloration of the originally colourless, transparent is films (see e.g. the article of A. W. Czanderna and F. J. Pern, "Encapsulation of PV modules using ethylene vinyl Acetate copolymer as a pottant: A critical review", Solar Energy Materials and Solar Cells 43 (1996) 101-181). Furthermore, other problems have been reported such as a delamination at interfaces, penetration of liquid water, short circuits and arcing, cracking of the solar cell elements due to expansion/contraction stresses, cell interconnect failures, charring and melting of solder from hot spots, excessive soiling and weathering.

It is an object of the present invention to provide an insulation material with which the drawbacks of the known technologies, especially of the use of peroxide cross-linked EVA copolymers as insulation material, can be avoided. In particular, it is an object of the invention to provide an insulation material which allows to improve and facilitate the production process of the photovoltaic module, e.g. by shortening the time necessary for lamination of the module, and, at the same time, has a lower tendency to degrade and provides an improved protection for the solar cell elements from detrimental external influences.

The present invention is based on the finding that the above objects can be achieved and such an insulation material can be provided if in the insulation material cross-linkable silane groups are present.

The invention therefore provides a photovoltaic module comprising a solar cell element and an insulation material laminated to at least one side of the solar cell element wherein the insulation material comprises an olefin copolymer which comprises silane group-containing monomer units.

Special advantages of the photovoltaic module of the invention are that it can be manufactured in a shorter time compared to common modules comprising peroxide containing EVA and hence productivity of the module lamination process is increased. This is due to the fact that, for example, cross-linking of the silane groups takes place already at ambient conditions. Accordingly, lower temperatures can be applied during lamination, and, as the cross-linking by silanes takes place "automatically" after the lamination process, no residence time is needed for the cross-linking process during the lamination step.

Corresponding residence time for the EVA insulation materials based on 1.47 wt-% of the commonly used peroxide 2,5-bis(tert.-butyldioxy)-2,5-dimethylhexane (Lupersol 101) to reach a gel content of 70% as a function of temperature are, for example, 45 minutes at 140° C., 15 minutes at 150° C., or 6 minutes at 160° C. (Data taken from Paul B Willis, "Investigation of materials and processes for solar cell encapsulation", JPL Contract 954527 S/L Project 6072:1, 1986).

The reduced lamination temperatures make it possible to use a wider range of front covers and back-sheets. For example, silane cross-linking will open up for replacing glass as front cover by lighter materials, e.g. polycarbonate, as the lamination process easily can take place below 130° C. As a load bearing material polycarbonate can combine properties like high stiffness with low weight and high toughness. These properties will facilitate the construction of roofs, lower breakage waste and reduce costs of fabrication, transportation and installation.

It is a further advantage that no corrosive and other by-products are formed upon cross-linking of the insulation material which may damage the photovoltaic cells. The by-products of the peroxide decompositions are furthermore volatile and in order to avoid void formation during the lamination process, pressure needs to be maintained until the laminate has been cooled down below the boiling points of the volatile decomposition products, typically below 80° C.

Still further, prior to lamination a thin film is produced which typically is 0.5 mm thick. For peroxide cross-linkable compounds the film extrusion process has to be made at much lower extrusion temperatures than optimal for film extrusion, reducing the output. Even at low extrusion temperature precuring (scorch) occurs which is seen as an increased gel content of the films. Larger gels result in ruptures of the film. The formed gels also negatively affect the light-transmission and reduce the insulation properties.

Silane cross-linkable compounds do not have these limitations and output can be raised due to the possibility to use more typical film extrusion temperatures, also resulting in a larger freedom in designing the initial melt viscosity of the polymer. The quality of the film and the photovoltaic module is raised due to the reduced risk for precuring, especially if proper scorch retardant additives as outlined in e.g. EP 449 939 or U.S. Pat. No. 5,350,812 are used.

The life length of a polymeric material is dependent on the stability of the polymer as such, but in order to withstand the elevated temperature and sun-irradiation in a photovoltaic module it is essential to add heat and UV stabilizers. The radicals formed during the peroxide cross-linking process destroy a great portion of these additives. As no radicals are involved in silane curing these kind of interactions will not occur.

In order to protect the solar cell element from water penetration it is essential to achieve good adhesion between the solar cell element and the insulation layer. Silane groups have been shown to covalently react with polar surfaces like glass, concrete, aluminium etc. Accordingly, the incorporated silane groups have two functions, namely cross-linking and adhesion promotion.

Preferably, the silane groups present in the insulation material are at least partly cross-linked.

In this embodiment, the insulation layer not only benefits from the increased adhesion to the solar cell module due to the presence of the silane groups, but also from the advantages of the silane group cross-linking process.

The olefin copolymer which comprises silane group-containing monomer units preferably is an ethylene or propylene copolymer, more preferably is an ethylene copolymer.

In a preferred embodiment, the olefin copolymer comprises additional comonomer units different from the main olefin monomer units and the silane group-containing monomer units.

In this embodiment, the olefin copolymer can be provided with improved properties such as softness and adhesiveness beneficial for its use as insulation material.

Such additional comonomer units may be chosen from polar and non-polar comonomers.

For example, non-polar comonomers may be selected from ethylene and alpha-olefins having three or more carbon atoms, preferably having 2 to 20 carbon atoms, and more preferably having 3 to 8 carbon atoms. Preferred examples of alpha-olefins are propylene, 1-butene, 1-hexene, 1-octene and 4-methyl-1-pentene, and aromatic vinyl compounds, such as styrene and alpha-ethyl styrene.

However, preferably, the additional comonomer units are polar comonomer units, so that an olefin copolymer including additional polar monomer units is used in the insulation layer, mainly in view of the good transparency and adhesion to the solar cell elements and other protective materials.

Such comonomers include (a) vinyl carboxylate esters, such as vinyl acetate and vinyl pivalate, (b) acrylates and alkylacrylates, such as methylacrylate and methylmethacrylate, ethylacrylate and ethylmethacrylate, butylacrylate and butylmethacrylate, (c) olefinically unsaturated carboxylic acids, such as acrylic acid and alkylacrylic acids such as methacrylic acid, maleic acid and fumaric acid, (d) acrylic acid and alkylacrylic acid derivatives, such as acrylonitrile and methacrylonitrile, and acrylic amide and methacrylic amide, (e) vinyl ethers, such as vinyl methyl ether and vinyl phenyl ether.

It is preferred that the polar comonomer is selected from the group of $C_1$- to $C_6$-alkyl acrylates, $C_1$- to $C_6$-alkyl methacrylates, acrylic acid, methacrylic acid and vinyl acetate, and more preferred the polar comonomer is selected from the group of $C_1$- to $C_4$-alkyl, such as methyl, ethyl, propyl or butyl, acrylates or vinyl acetate.

Still more preferably, the polar comonomer is selected from the group of butyl acrylate, ethyl acrylate, methyl acrylate, butyl alkylacrylates, ethyl alkylacrylates and methyl alkylacrylates, especially from butyl acrylate, ethyl acrylate and methyl acrylate.

A particularly preferred polar comonomer comprises, or consists of, methylacrylate and methylalkylacrylates, especially methylacrylate, because of the low degradation tendency of olefin/methylacrylate and olefin methylalkylacrylates, especially ethylene methyl acrylate (EMA) copolymers.

Preferably, the content of the additional comonomer units in the olefin copolymer is from 2 to 60 wt. %, more preferably is from 5 to 50 wt. %, still more preferably is from 10 to 45 wt. %, and most preferably is from 20 to 40 wt. %.

Furthermore, it is preferred that the content of the additional comonomer units in the olefin copolymer is from 2 to 30 mol %, more preferably is from 4 to 25 mol %, still more preferably is from 6 to 20 mol %, and most preferably is from 8 to 18 mol %.

The olefin copolymer of the insulation material comprises hydrolysable silane groups.

The hydrolysable silane groups may be introduced into the polyolefin by copolymerisation of e.g. ethylene monomers with silane group containing comonomers, or by grafting, i.e. by chemical modification of the polymer by addition of silane groups mostly in a radical reaction. Both techniques are well known in the art, e.g. from U.S. Pat. No.

4,413,066, U.S. Pat. No. 4,297,310, U.S. Pat. No. 4,351,876, U.S. Pat. No. 4,397,981, U.S. Pat. No. 4,446,283 and U.S. Pat. No. 4,456,704.

Cross-linking may be performed by condensation of silanol groups contained in the polyolefin which are obtained by hydrolysation of silane groups.

Preferably, the silane group-containing polyolefin has been obtained by copolymerisation.

The copolymerisation is preferably carried out with an unsaturated silane compound represented by the formula $$R^1SiR^2_qY_{3-q} \quad (V)$$

wherein
$R^1$ is an ethylenically unsaturated hydrocarbyl, hydrocarbyloxy or (meth)acryloxy hydrocarbyl group,
$R^2$ is an aliphatic saturated hydrocarbyl group,
Y which may be the same or different, is a hydrolysable organic group and
q is 0, 1 or 2.

Special examples of the unsaturated silane compound are those wherein $R^1$ is vinyl, allyl, isopropenyl, butenyl, cyclohexanyl or gamma-(meth)acryloxy propyl; Y is methoxy, ethoxy, formyloxy, acetoxy, propionyloxy or an alkyl- or arylamino group; and $R^2$, if present, is a methyl, ethyl, propyl, decyl or phenyl group.

A preferred unsaturated silane compound is represented by the formula $$CH_2=CHSi(OA)_3 \quad (VI)$$

wherein A is a hydrocarbyl group having 1-8 carbon atoms, preferably 1-4 carbon atoms.

The most preferred compounds are vinyl trimethoxysilane, vinyl bismethoxyethoxysilane, vinyl triethoxysilane, gamma-(meth)acryloxypropyltrimethoxysilane, gamma (meth)acryloxypropyltriethoxysilane, and vinyl triacetoxysilane.

The copolymerisation of the olefin, e.g. ethylene, the unsaturated silane compound and, optionally, further monomers may be carried out under any suitable conditions resulting in the copolymerisation of the monomers.

The amount of the silane group-containing monomer units in the olefin copolymer preferably is from 0.1 to 10 wt. %, more preferably is from 0.2 to 8 wt. %, and most preferably is from 0.5 to 5 wt. %.

The olefin copolymer preferably has a $MFR_2$ (ISO 1133, 2.16 kg/190° C.) of 0.5 to 100 g/10 min, more preferably of 2.5 to 50 g/10 min.

For cross-linking of olefin copolymers comprising monomer units with silane groups, a silanol condensation catalyst is preferably used, so that in the photovoltaic module of the invention cross-linking of the silane groups of the olefin copolymer preferably has been effected by the use of a silanol condensation catalyst.

Thus, preferably the composition used for the production of the insulation layer of the photovoltaic module of the invention comprises a silanol condensation catalyst.

Conventional catalysts are for example tin-organic compounds such as dibutyl tin dilaurate (DBTDL).

It is further known that the cross-linking process advantageously is carried out in the presence of acidic silanol condensation catalysts. In contrast to the conventional tin-organic catalysts, the acidic catalysts allow cross-linking to quickly take place already at room temperature. Such acidic silanol condensation catalysts are disclosed for example in WO 95/17463. The contents of this document is enclosed herein by reference.

The silanol condensation catalysts of the polyolefin composition furthermore preferably is a Brönsted acid, i.e. is a substance which acts as a proton donor.

The Brönsted acids may comprise inorganic acids such as sulphuric acid and hydrochloric acid, and organic acids such as citric acid, stearic acid, acetic acid, sulphonic acid and alkanoic acids as dodecanoic acid, or a precursor of any of the compounds mentioned.

Preferably, the Brönsted acid is a sulphonic acid, more preferably an organic sulphonic acid.

Still more preferably, the Brönsted acid is an organic sulphonic acid comprising 10 C-atoms or more, more preferably 12 C-atoms or more, and most preferably 14 C-atoms or more, the sulphonic acid further comprising at least one aromatic group which may e.g. be a benzene, naphthalene, phenantrene or anthracene group. In the organic sulphonic acid, one, two is or more sulphonic acid groups may be present, and the sulphonic acid group(s) may either be attached to a non-aromatic, or preferably to an aromatic group, of the organic sulphonic acid.

Further preferred, the aromatic organic sulphonic acid comprises the structural element:

$$Ar(SO_3H)_x \quad (II)$$

with Ar being an aryl group which may be substituted or non-substituted, and x being at least 1.

The organic aromatic sulphonic acid silanol condensation catalyst may comprise the structural unit according to formula (II) one or several times, e.g. two or three times. For example, two structural units according to formula (II) may be linked to each other via a bridging group such as an alkylene group.

Preferably, Ar is a aryl group which is substituted with at least one $C_4$- to $C_{30}$-hydrocarbyl group, more preferably $C_4$- to $C_{30}$-alkyl group.

Aryl group Ar preferably is a phenyl group, a naphthalene group or an aromatic group comprising three fused rings such as phenantrene and anthracene.

Preferably, in formula (II) x is 1, 2 or 3, and more preferably x is 1 or 2.

Furthermore, preferably the compound used as organic aromatic sulphonic acid silanol condensation catalyst has from 10 to 200 C-atoms, more preferably from 14 to 100 C-atoms.

In one preferred embodiment, Ar is a hydrocarbyl substituted aryl group and the total compound containing 14 to 28 carbon atoms, and still further preferred, the Ar group is a hydrocarbyl substituted benzene or naphthalene ring, the hydrocarbyl radical or radicals containing 8 to 20 carbon atoms in the benzene case and 4 to 18 atoms in the naphthalene case.

It is further preferred that the hydrocarbyl radical is an alkyl substituent having 10 to 18 carbon atoms and still more preferred that the alkyl substituent contains 12 carbon atoms and is selected from dodecyl and tetrapropyl. Due to commercial availability it is most preferred that the aryl group is a benzene substituted group with an alkyl substituent containing 12 carbon atoms.

The currently most preferred compounds are dodecyl benzene sulphonic acid and tetrapropyl benzene sulphonic acid.

The silanol condensation catalyst may also be precursor of the sulphonic acid compound, including all its preferred embodiments mentioned, i.e. a compound that is converted by hydrolysis to such a compound. Such a precursor is for example the acid anhydride of a sulphonic acid compound, or a sulphonic acid that has been provided with a hydrolysable protective group, as e.g. an acetyl group, which can be removed by hydrolysis.

In a second preferred embodiment, the sulphonic acid catalyst is selected from those as described in EP 1 309 631 and EP 1 309 632, namely
a) a compound selected from the group of
(i) an alkylated naphthalene monosulfonic acid substituted with 1 to 4 alkyl groups wherein each alkyl group is a linear or branched alkyl with 5 to 40 carbons with each alkyl group being the same or different and wherein the total number of carbons in the alkyl groups is in the range of 20 to 80 carbons;
(ii) an arylalkyl sulfonic acid wherein the aryl is phenyl or naphthyl and is substituted with 1 to 4 alkyl groups wherein each alkyl group is a linear or branched alkyl with 5 to 40 carbons with each alkyl group being the same or different and wherein the total number of carbons in the alkyl groups is in the range of 12 to 80;
(iii) a derivative of (i) or (ii) selected from the group consisting of an anhydride, an ester, an acetylate, an epoxy blocked ester and an amine salt thereof which is hydrolysable to the corresponding alkyl naphthalene monosulfonic acid or the arylalkyl sulfonic acid;
(iv) a metal salt of (i) or (ii) wherein the metal ion is selected from the group consisting of copper, aluminium, tin and zinc; and
b) a compound selected from the group of
(i) an alkylated aryl disulfonic acid selected from the group consisting of the structure (III):

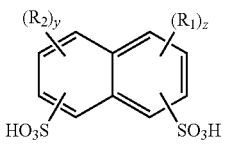

and the structure (IV):

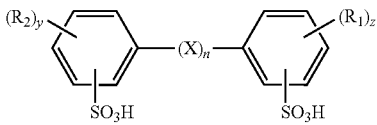

wherein each of $R_1$ and $R_2$ is the same or different and is a linear or branched alkyl group with 6 to 16 carbons, y is 0 to 3, z is 0 to 3 with the proviso that y+z is 1 to 4, n is 0 to 3, X is a divalent moiety selected from the group consisting of —C($R_3$)($R_4$)—, wherein each of $R_3$ and $R_4$ is H or independently a linear or branched alkyl group of 1 to 4 carbons and n is 1; —C(=O)—, wherein n is 1; —S—, wherein n is 1 to 3 and —S(O)$_2$—, wherein n is 1; and
(ii) a derivative of (i) selected from the group consisting of the anhydrides, esters, epoxy blocked sulfonic acid esters, acetylates, and amine salts thereof which is a hydrolysable to the alkylated aryl disulfonic acid,
together with all preferred embodiments of those sulphonic acids as described in the mentioned European Patents.

Preferably, in the polyolefin composition used for the production of the insulation material of the photovoltaic module, the silanol condensation catalyst is present in an amount of 0.0001 to 6 wt. %, more preferably of 0.001 to 2 wt. %, and most preferably 0.02 to 0.5 wt. %.

Preferably, in the final insulation material the olefin copolymer is cross-linked to a degree of at least 50%, more preferably at least 60%, and most preferably to at least 70%.

The final insulation material preferably has a total hemispherical light transmission larger than 90% of incident light at 400-1100 nm.

Preferably, the final insulation material has a glass transition temperature below −40° C.

Furthermore, preferably the final insulation material has a water absorption of <0.5 wt-% at 20° C./100% relative humidity.

Still further, the final insulation material preferably has a tensile modulus of 100 MPa or less, more preferably of 50 MPa or less, still more preferably of 30 MPa or less and most preferably of 25 MPa or less (ISO 527-2, 1 mm/min).

Finally, the final insulation material preferably has a brittleness temperature of −40° C. or below.

In the photovoltaic module of the invention, the insulation layer(s) preferably has a thickness of 0.1 to 5 mm, more preferably of 0.2 to 3 mm, and most preferably of 0.3 to 1 mm.

In the composition used for the production of the insulation layer, in addition to the olefin copolymer comprising silane-group containing monomer units and the silanol condensation catalyst further components may be present.

However, it is preferred that the olefin copolymer comprising silane-group containing monomer units is present in the composition for making the insulation layer in an amount of at least 30 wt. %, more preferably at least 50 wt. % and most preferably at least 90 wt. %.

Preferred additives present in the composition used for the production of the isolation layer are UV absorbers, UV stabilisers, and/or anti-oxidants.

Furthermore, preferably a scorch retarding agent is present in the composition.

The amount of additives, preferably of UV absorbers, UV stabilisers, anti-oxidants and/or scorch retarding agent, which are present in the composition for making the insulation layer, preferably is 5 wt. % or less, more preferably of 3 wt. % or less.

The photovoltaic module of the invention furthermore preferably comprises a transparent protective front cover. Any common type of front cover can be used, such as made of glass, acrylic resins, polycarbonate resins, polyester resins, and fluorine-containing polymers.

Typically, the thickness of the front cover is from 1 to 10 mm, more preferably from 2 to 6 mm.

Insulation layer(s) comprising an olefin copolymer which comprises silane-group containing monomer units in any of the above described embodiments are well suited for use together with polycarbonate front covers, because a lower temperature can be used in the lamination process for producing the photovoltaic module laminate. Thus, in one embodiment of the photovoltaic module of the invention, the module comprises a front cover comprising or consisting of a polycarbonate resin.

The photovoltaic module of the invention furthermore preferably comprises a protective back or bottom cover. Any type of back cover can be used, such as a metal or a single- or multi-layer sheet such as a film of a thermoplastic resin. Examples of the back cover protective material include metals such as tin, aluminum and stainless steel, inorganic materials such as glass and single- or multi-layer protective materials of polyester, inorganic material-metallized polyesters, fluorine-containing resins and polyolefins. A commonly used back cover is a three layer laminate made of a first polyvinyl fluoride (PVF) layer, a water vapour barrier layer such as a metal e.g. aluminium layer or a polyethylene terephthalate layer, and a second polyvinyl fluoride (PVF) layer. Such a three layer film comprising polyethylene terephthalate as intermediate layer is also denoted as TPT film.

The possibilities of a reduced lamination temperature of the invention opens up for a wider use lighter, less hydrolyse sensitive, and cheaper materials e.g. high density polyethylene and polypropylene which also have excellent electrical and barrier properties. Thus, in one embodiment the photovoltaic module of the invention a sheet or film as a protective back or bottom cover which comprises polyethylene and/or polypropylene.

Usually, the thickness of the back cover is from 50 to 500 micrometer, more preferably from 80 to 250 micrometer.

Typically, the photovoltaic module of the invention comprises, or consists of, a front cover, a first insulation layer, solar cell elements which are interconnected by a conducting material, a second insulation layer, and a back cover, optionally supported by a metal such as aluminium frame.

In the photovoltaic module of the invention, at least one, but preferably both, insulation layer(s) comprise an olefin copolymer which comprises silane group-containing monomer units in any of the above-described embodiments.

The present invention is also directed to a process for the production of a photovoltaic module which comprises laminating a sheet of an insulation material comprising an olefin copolymer which comprises silane group-containing monomer units in any of the above described embodiments to a solar cell element.

Usually, the composition used for the production of the insulation layer is extruded into a sheet having the desired thickness.

It is preferred that during extrusion cross-linking is avoided as far as possible, i.e. that no scorch occurs. This may be provided by the use of a scorch retarding agent, such as described e.g. in EP 449 939 or U.S. Pat. No. 5,350,812.

Cross-linking of the extruded sheet may be partially or completely carried out before the lamination step for producing the final photovoltaic module laminate.

However, the extruded sheet may also be cross-linked to the desired degree only during or after the lamination process.

The lamination process can be carried out in a conventional laminator apparatus.

Preferably, the temperature during the lamination process is 150° C. or below, more preferably is 130° C. or below, and most preferably is 100° C. or below.

The pressure used during lamination usually is below 2 bar, more preferably is below 1 bar.

The total lamination time preferably is below 30 min, more preferably is below 20 min, and most preferably is below 10 min.

The invention furthermore relates to the use of an olefin copolymer which comprises silane group-containing monomer units in any of the above described embodiments as an insulation material for solar cell elements.

The present invention will be further illustrated by way of an example, and by reference to the following figures:

FIG. 1: Results of peeling tests showing influence of vinyl trimethoxy groups on the adhesion strengths towards aluminium.

Figure 2:
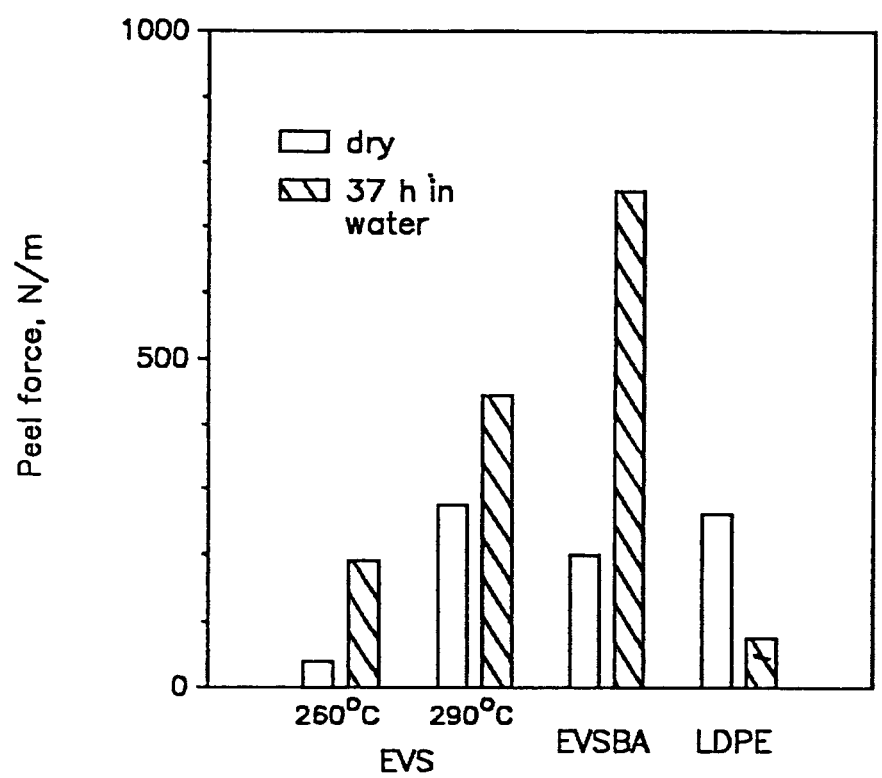

FIG. 2: Results of peeling tests after ageing in water showing increase of adhesion strength after treatment in water.

A sheet useable as an insulation layer of a photovoltaic module was produced starting from a composition with the components as given in Table 1.

Three ethylene terpolymers (Terpolymers 1, 2 and 3) consisting of vinyl trimethoxysilane silane (VTMS) and methylacrylate (MA) or butylacrylate (BA), respectively, were produced on commercial tubular reactors at 2800 to 3300 bar and 240 to 280° C. peak temperatures.

The polymers are described in Table 1 and compared with the EVA polymer Elvax 150 (Comparative Example 1), which has been the dominating material for insulation following the recommendations from the "Low cost flat plate silicon array project" carried out at the Jet Propulsion Laboratory. The project started 1975 and the outcome of the project is reported in Paul B Willis, "Investigation of materials and processes for solar cell encapsulation", JPL Contract 954527 S/L Project 6072:1, 1986 (hereinafter denoted as ref JPL).

TABLE 1

| | Test method | Terpolymer 1 | Terpolymer 2 | Terpolymer 3 | Comparative Example (Elvax 150) |
|---|---|---|---|---|---|
| Monomer Comonomer 1 | | Ethylene | Ethylene | Ethylene | Ethylene |
| Type | | MA | MA | BA | VA |
| Amount, wt-% | | 31 | 20 | 17 | 32 |
| Amount, mol-% | | 12.7 | 7.5 | 4.2 | 13.2 |
| Comonomer 2 | | | | | |
| Type | | VTMS | VTMS | VTMS | None |
| Amount, wt-% | | 1.0 | 1.2 | 1.9 | 0 |
| $MF_{2.16}$, g/10 min (2.16 kg/190° C.) | ISO 1133 | 3.0 | 10.1 | 5.3 | 35 |
| Density | ISO 2781 | 958 | | 928 | 957 |
| Melt temperature, ° C. | ISO 3146 | 70 | 76 | 96 | 63 |
| Vicat softening point at 10N, ° C. | ISO 306 | <40 | | <40 | 36 |
| Hardness | ISO 868 | 53 | | 88 | 65-73 |

TABLE 1-continued

| | Test method | Terpoly-mer 1 | Terpoly-mer 2 | Terpoly-mer 3 | Comparative Example (Elvax 150) |
|---|---|---|---|---|---|
| Shore A Hardness | ISO 868 | 10 | | 28 | 24 |
| Shore D Tensile modulus, MPa | ISO 527-2, 1 mm/min | 2.4 | 20 | 31 | 2.2 |
| Tensile strength at break, MPa | ISO 37, 50 mm/min | 8 | | 13 | 7.5 |
| Brittleness temperature, °C. | ISO 812 | <−70 | | <−70 | −100 |
| Volume resistivity, 'Ω-cm at 20° C. | IEC 93 | $1.4 \times 10^{14}$ | | $2.5 \times 10^{16}$ | $1 \times 10^{14}$ |
| Dielectric constant at 50 Hz, 20° C. | IEC 250 | 3.21 | | 2.69 | 2.6 |
| Power factor at 50 Hz, | IEC 250 | 0.002 | | 0.0009 | 0.003 |

In Table 2 a summary of the key properties of insulation materials for PV-modules are collected based on the finding in the JPL report (ref JPL).

TABLE 2

| Characteristic | Requirement | Source |
|---|---|---|
| Glass transition temperature | <−40° C. | (1) |
| Total hemispherical light transmission at 400-1100 nm | >90 incident | (1) |
| Hydrolysis | None at 80° C., 100% relative humidity | (1) |
| Resistance to thermal oxidation | Stable up to 85° C. | |
| Mechanical creep | None at 90° C. | |
| Tensile modulus | <20.7 MPa | |
| UV absorption degradation | None at wavelength >350 nm | |
| Hazing or clouding | None at 80° C., 100 relative humidity | |
| Odor, human hazards | None | |
| VA content | >25% in order to reach an acceptable optical transmission of 89 to 92% | |
| Gel content | >70% results in resistance in thermal creep with margin at 110° C. | |

Table 1 shows that the incorporation of VTMS into the polymer chain and the replacement of vinylacetate by butylacrylate do not result in any significant differences in tensile strength, tensile modulus, electrical and low temperature properties as well as in hardness and melting point. It is also shown that these properties these can be controlled by the molar amount of comonomer 2. As outlined in ref JPL, the optical properties and tensile modulus are controlled by the crystallinity of the polymer and in order to reach an acceptable optical transmission the VA content should be >25 wt-% (>9.8 mol-%).

In order to control the cross-linking properties, a tape of a thickness of 0.5 mm was produced on a Brabender tape extruder with a length/diameter ratio of 20. The temperature setting was 120-150-170° C. Prior to extrusion the different terpolymers were mixed with 5% of a masterbatch consisting of 96.5 wt-% of an ethylene butylacrylate copolymer (MFR$_2$=7 g/10 min, BA content=17 wt-%), 1.5 wt-% of dodecylbenzene sulphonic acid as cross-linking catalyst and 2 wt-% 4,4-thiobis(2-tert.butyl-5-methylphenol) as stabilizer. The tapes were stored for 24 hours and 50% relative humidity at 23° C. prior to determination of cross-linking properties. The gel content was determined by putting milled tapes in boiling decaline for 10 hours.

TABLE 3

| | Test method | Terpoly-mer 1 | Terpoly-mer 2 | Terpoly-mer 3 |
|---|---|---|---|---|
| Gel-content, wt-% | Decaline | 78 | 77 | 82 |
| Hot-set test 200° C., 0.20 MPa | IEC 811-2-1 | | | |
| Elongation | | 20 | 25 | 15 |
| Permanent set | | 0 | 0 | 0 |

It can be concluded that all tapes based on any of Terpolymers 1 to 3 give suitable cross-linking degrees as insulation for photovoltaic modules after storage at ambient conditions.

In order to evaluate the cross-linked tapes resistance to hydrolysis, the cross-linked tapes of Terpolymers 1 and 3 were stored in water. After the exposure, tensile strength at break, elongation at break according to ISO 37 (tensile testing speed=500 mm/min) and weight changes were evaluated. The results are reported in Table 4.

TABLE 4

| Sample | Solution | Temp., °C. | Time, Days | Weight Change, wt-% | Tensile strength MPa | Elongation, % |
|---|---|---|---|---|---|---|
| Terpol. 1 | None | — | — | — | 3.0 | 210 |
| Terpol. 1 | Water | 23 | 30 | 0.1 | 3.0 | 184 |
| Terpol. 1 | Water | 50 | 30 | 0.1 | 3.6 | 234 |
| Terpol. 1 | Water | 100 | 7 | 0.7 | 2.9 | 166 |
| Terpol. 3 | None | — | — | — | 4.6 | 42 |
| Terpol. 3 | Water | 23 | 30 | 0.1 | 5.5 | 71 |
| Terpol. 3 | Water | 50 | 30 | 0 | 4.4 | 41 |
| Terpol. 3 | Water | 100 | 7 | 0.4 | 4.9 | 55 |

The results show that Terpolymers 1 and 3 are resistant to hydrolysis in conditions relevant for photovoltaic modules.

In order to evaluate the thermal stability of different possible copolymers, the following samples were heat treated in a thermogravimetric analyzer at 333° C. in a nitrogen atmosphere:

EBA-4,3: Ethylene butyl acrylate (BA) copolymer, BA content 17 wt-% (4.3 mol-%), $MFR_2$=6 g/10 min, EEA-4,8: Ethylene ethylacrylate (EA) copolymer, EA content 15 wt-% (4.8 mol-%), $MFR_2$=8 g/10 min, EHEMA-1,8: Ethylene hydroxylethyl methacrylate (HEMA) copolymer, HEMA content 8 wt-% (1.8 mol-%), $MFR_2$=1.5 g/10 min, EMA-5,7: Ethylene methyl acrylate copolymer, MA content 15.6 wt-% (4.8 mol-%), $MFR_2$=15 g/10 min, EMMA-4,9: Ethylene methyl methacrylate (MMA) copolymer, MMA is content 14.1 wt-% (4.9 mol-%), $MFR_2$=8 g/10 min, EVA-6,7: Ethylene vinyl acetate (VA) copolymer, VA content 28 wt-% (6.7 mol-%), $MFR_2$=8 g/10 min.

The results of the thermal stability tests are shown in Table 5.

TABLE 5

| Sample | Time at 333° C., min | Weight loss, wt-% |
|---|---|---|
| EBA-4,3 | 120 | 4.5 |
| EEA-4,8 | 120 | 3.8 |
| EHEMA-1,8 | 120 | 4.4 |
| EMMA-4,9 | 120 | 2.7 |
| EMA-5,7 | 120 | 2.6 |
| EVA-6,7 | 90 | 13.1 |

It is evident that the most preferred groups for crystallinity control of terpolymers intended photovoltaic module are methyl acrylate or methyl methacrylate.

In order to study the influence of the vinyl trimethoxy silane groups on the polymers adhesion to polar substrates, 200 μm thick films of Terpolymer 3 and an ethylene vinyl trimethoxy silane copolymer containing 2 wt-% VTMS, $MFR_2$=0.9 g/10 min were pressed by putting each film in between 150 μm thick aluminium foils and pressing together at 250° C. for 10 seconds at a pressure of 1.3 MPa.

After one week at ambient conditions, the peel force was tested in an Instron 1122 by a 180° T-peel test, with a crosshead speed of 200 mm/min. The width of the test strip were 25 mm. The same test procedure were also performed on ethylene butylacrylate copolymers and ethylene acrylic acid copolymers. The latter is known to give excellent adhesion strength towards polar substrates. The results of the tests are shown in FIG. 1.

The silane group-containing laminates were further on treated in water heated to 85° C. for 37 hours and compared with a laminate in which the plastic film was corona treated low density polyethylene (LDPE). The results of the tests are shown in FIG. 2. The tests show that vinyl trimethoxy silane groups have a dramatic influence on the adhesion strength which even increases after treatment in water.

The invention claimed is:

1. A photovoltaic module comprising a solar cell element and an insulation material laminated to at least one side of the solar cell element wherein the insulation material is formed from a polymeric material consisting of an olefin copolymer obtained by copolymerization which comprises from 0.5 to 5 wt. % of silane group-containing monomer units, main olefin monomer units, and from 10 to 45 wt % of polar comonomer units, the polar comonomer units being selected from acrylates and alkylacrylates.

2. Photovoltaic module according to claim 1, wherein the silane groups are at least partly crosslinked.

3. Photovoltaic module according to claim 1, wherein the olefin copolymer is an ethylene copolymer.

4. Photovoltaic module according to claim 1, wherein the amount of the polar comonomer units in the olefin copolymer is from 20 to 40 wt. %.

5. The photovoltaic module according to claim 1, further comprising a protective back cover consisting of glass, metal, or a single-layer sheet of a thermoplastic resin.

6. The photovoltaic module according to claim 5, wherein the protective back cover consists of glass.

7. The photovoltaic module according to claim 5, wherein the protective back cover consists of metal.

8. The photovoltaic module according to claim 5, wherein the protective back cover consists of the single-layer sheet.

9. Process for the production of a photovoltaic module according to claim 1, which comprises laminating a sheet of the insulation material to the solar cell element.

* * * * *